(12) United States Patent
Sirignano

(10) Patent No.: US 8,526,169 B2
(45) Date of Patent: Sep. 3, 2013

(54) MULTI-TENANT, ALL-IN-ONE DISTRIBUTION AND OVER CURRENT SAFETY BOX WITH MAIN DISCONNECTING MEANS FOR SOLAR AND WIND GENERATOR SYSTEMS

(76) Inventor: Michael Sirignano, Carteret, NJ (US)

( * ) Notice: Subject to any disclaimer, the term of this patent is extended or adjusted under 35 U.S.C. 154(b) by 237 days.

(21) Appl. No.: 13/135,699

(22) Filed: Jul. 14, 2011

(65) Prior Publication Data
US 2013/0016454 A1    Jan. 17, 2013

(51) Int. Cl.
*H02B 1/20* (2006.01)
(52) U.S. Cl.
USPC ........... 361/626; 361/602; 361/622; 361/641; 361/642; 361/643; 361/690; 361/695
(58) Field of Classification Search
None
See application file for complete search history.

(56) References Cited

U.S. PATENT DOCUMENTS

| | | | |
|---|---|---|---|
| 4,060,843 A * | 11/1977 | Bost | 361/76 |
| 4,819,180 A * | 4/1989 | Hedman et al. | 700/291 |
| 6,018,452 A * | 1/2000 | Meyerhoefer et al. | 361/111 |
| 7,132,951 B2 * | 11/2006 | Ziejewski et al. | 340/635 |
| 7,170,395 B2 * | 1/2007 | Crenshaw et al. | 340/12.32 |
| 7,397,652 B2 * | 7/2008 | Price et al. | 361/643 |
| 7,907,388 B2 * | 3/2011 | DeBoer et al. | 361/628 |
| 8,212,405 B2 * | 7/2012 | Pifer et al. | 307/70 |
| 2008/0100993 A1 * | 5/2008 | Muller et al. | 361/624 |

* cited by examiner

*Primary Examiner* — Boris Chervinsky
(74) *Attorney, Agent, or Firm* — Charles I. Brodsky

(57) ABSTRACT

A weatherproof box enclosure adapted to be secured on one of an outside wall and roof location of a multi-tenant building structure supporting roof-mounted solar panel or wind turbine generators including a multiple pole control unit receiving and distributing received alternating current voltages from the generators, which is disengagable by a normally open override switch when supplied voltages fall below a predetermined level, when servicing of the components of the safety box enclosure is to be had, and automatically in the event of an emergency as representative of a closing of the override switch by a ground level control.

12 Claims, 2 Drawing Sheets

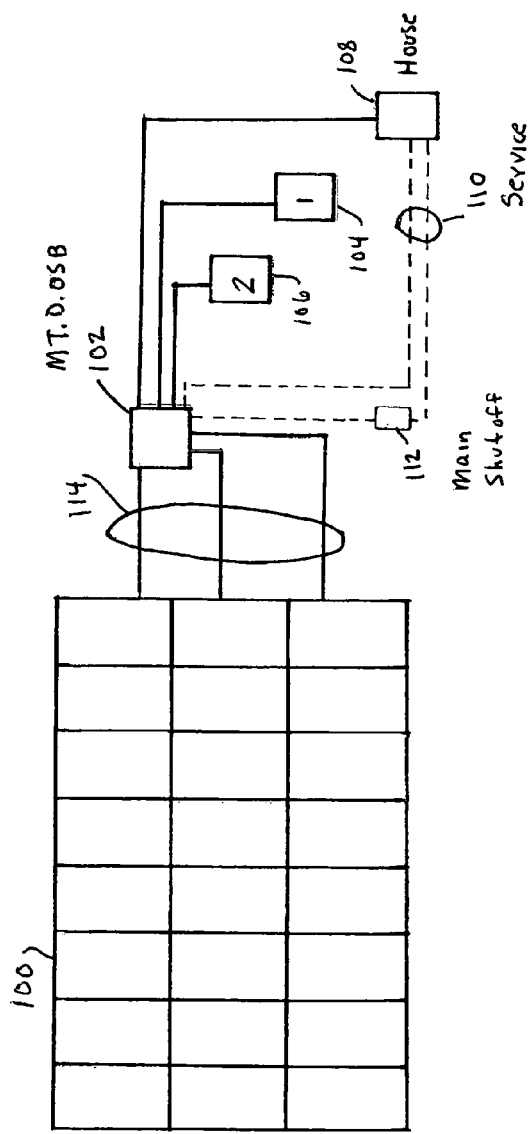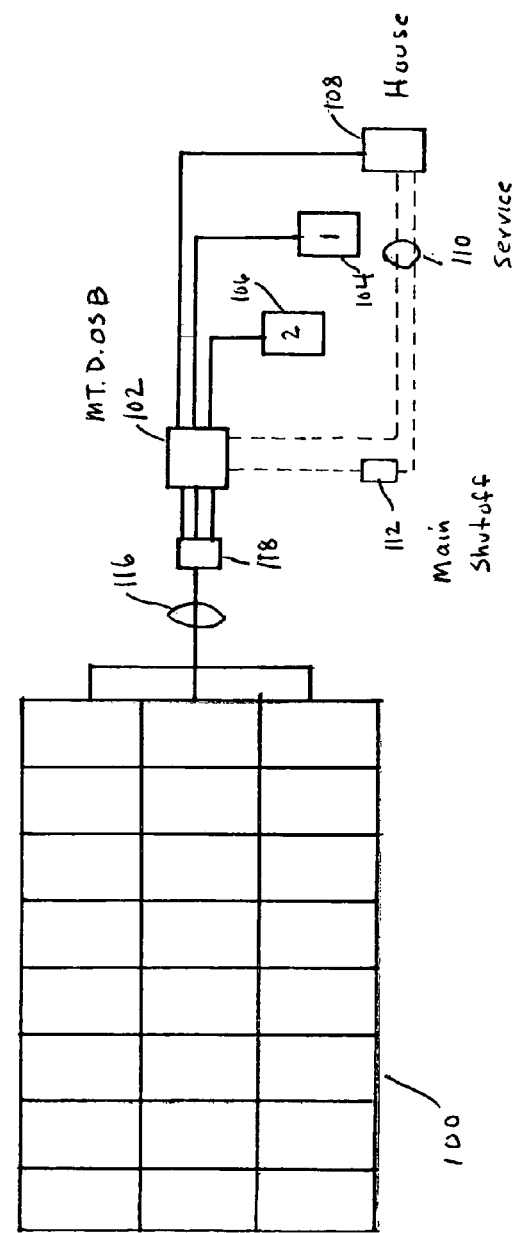

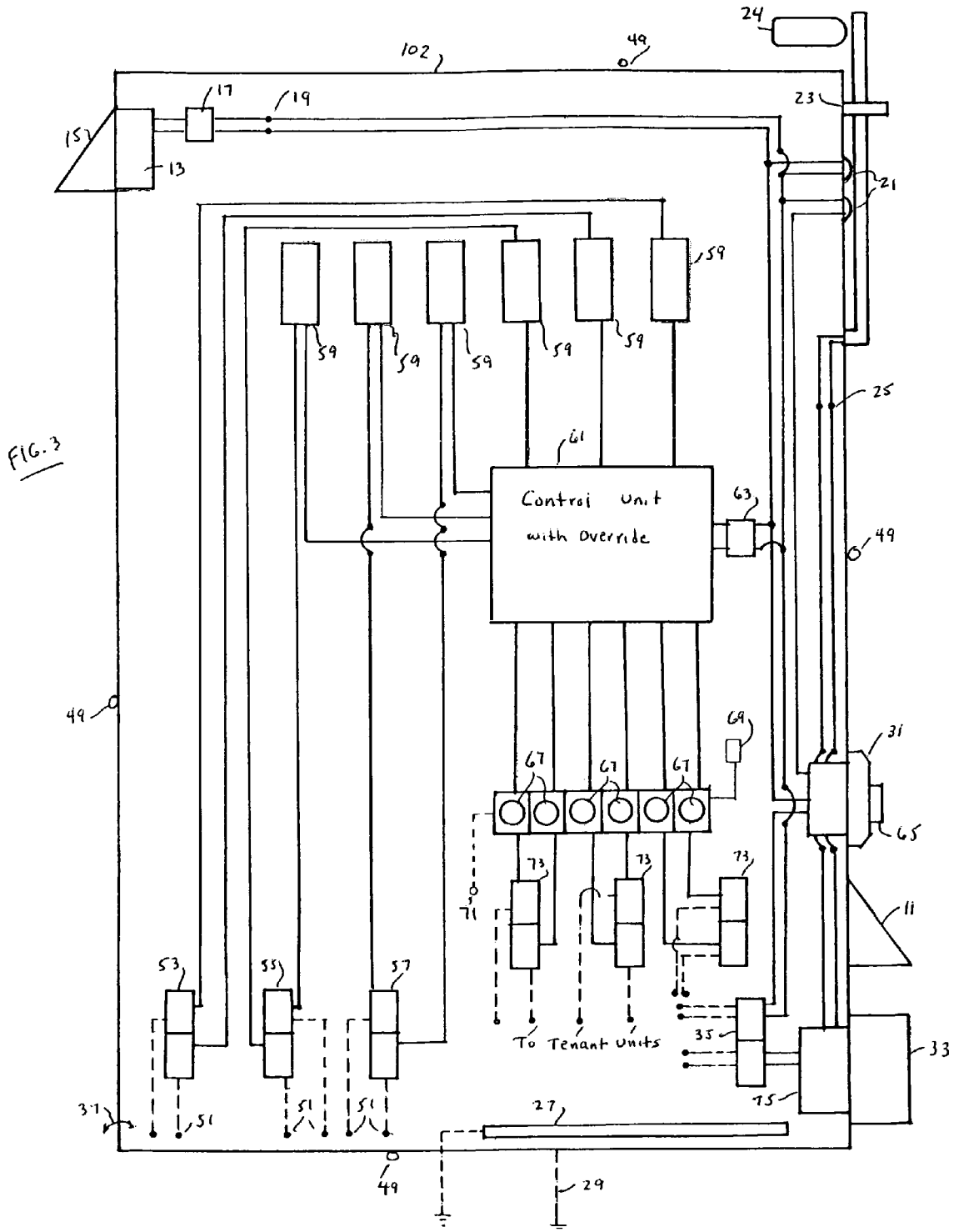

MULTI-TENANT, ALL-IN-ONE DISTRIBUTION AND OVER CURRENT SAFETY BOX WITH MAIN DISCONNECTING MEANS FOR SOLAR AND WIND GENERATOR SYSTEMS

CROSS-REFERENCE TO RELATED APPLICATIONS

None

STATEMENT REGARDING FEDERALLY SPONSORED RESEARCH OR DEVELOPMENT

Research and development of this invention and Application have not been federally sponsored, and no rights are given under any Federal program.

REFERENCE TO A MICROFICHE APPENDIX

Not Applicable

BACKGROUND OF THE INVENTION

1. Field of the Invention

This invention relates to the distribution of solar and wind generated electricity to a multi-tenant complex, in general, and to an apartment building, office building, shopping center stores and school constructions, in particular.

2. Description of the Related Art

As will be appreciated, such complexes are typically defined by having electric control rooms in their respective basements. With solar panels and wind turbines proposed to be located on their roofs, extensive wiring and control panels would be needed to bring the generated electricity down to the control rooms from the roofs, and from there to the respective users in the multi-tenant complex. In many instances, however, accessibility is a problem—and in all, the requisite conversion installation would be overly costly. One reason for this is that the designed assembly would still have to satisfy the life safety issues imposed by the National Electrical Code.

With the invention to be described below, a multi-tenant distribution and over-current safety box will be seen to eliminate much of the wiring coming down from the solar panel array or wind turbine by altering the service interconnections outside the structure—while at the same time permitting each of the multi-unit occupiers to have their own segment of the array or turbine for their own designation. At the same time, the life-safety issues associates with firematic protection for emergency responders would be satisfied both as to the occupiers of the units and as to fire department personnel as well, from outside the structure. And, as will be appreciated, the safety box of the invention, would be able to provide its benefits as part of a newly constructed multi-tenant installation at the same time.

SUMMARY OF THE INVENTION

As will be described, the safety box of the invention is constructed of a weatherproof National Electrical Manufacturers Association-3 or plastic/composite fabrication of an ability to withstand UV radiation, and excessive heat buildup. Those latter characteristics will exist whether the location of the safety box outside the structure be on an outside wall or preferably on its roof exposed to environmental heat buildup. As will additionally be described, the safety box enclosure would incorporate an exterior main-disconnecting switch with its own lockout for servicing, situated on the side of the safety box. There, a main feed originating from the house building panel of a designated 15-20 amp, 120 volt circuit will be provided, feeding off the owner or house panel which would first be fed to a main shutoff located at ground level where it would be readily accessible for emergency purposes. A lockout switch cover is similarly provided in enabling the main feed that is supplying the voltage to the coil of the contactor to be disengaged. With the two manners of disconnect having notification labeling as to their designated purposes, an important safety issue will thus be satisfied.

The multi-tenant safety box enclosure also includes a service GFCI outlet/switch combination unit with an in-use weatherproof cover mounted on the side of the box. Such switch controls a preassembled light kit required under code enforcement for servicing, and will be fed with its own independent 20 amp circuit. Such circuit would be suitable for the service outlet, the light kit, and any other accessories that may be desired—such as a cooling fan.

The safety box of the invention also includes a preassembled 50 watt halogen weatherproof light kit with its own metal conduit pole. Such kit fastens to the enclosure through a ½ inch pre-made knockout located on the side of the box, supported by a standard ½ inch EMT style clamp. With a polarized wire harness incorporated for quick installation, the light kit's conductors are connected, and controllable by the switch located on the service outlet through its own service outlet circuit.

The safety box enclosure of the invention further recognizes the benefits of having adequate ventilation—so that the safety box also is constructed with locations for mounting weatherproof vent covers on the top and bottom sides of the enclosure to promote good air circulation and to help with the de-rating of the system. The power supply plug and play connector can provide quick connection or cooling fan and thermostat accessory—either optionally or as a standard feature of the construction.

Another feature of the multi-tenant safety box is the inclusion of a 2 LED jewel indicator light located on the side of the safety box enclosure to indicate the status of the system when it is in use, or when it is not in use. In such preferred configuration, the color RED is employed in showing the disengagement of the system from a tenant's panel, while the color GREEN is employed in showing the system being active in supplying its electrical power to the various tenant units.

With a bonding point located on the exterior of the safety box to bond the enclosure, its frame/supports and the metal frame of the solar panel/wind turbine, the end result is a single, self-contained unit, constructable with off-the-shelf components for an ease of servicing and/or replacement of parts straight from an electrical supply house. All components, when operative in conjunction, serve to protect the conductors going to the individual tenant's panels, along with the opportunity to simultaneously disengage everything in the event of an emergency or servicing.

BRIEF DESCRIPTION OF THE DRAWINGS

These and other features of the invention will be more clearly understood from a consideration of the following description, taken in connection with the accompanying drawings, in which:

FIGS. 1 and 2 are block diagrams helpful in an understanding of the environment in which the multi-tenant, all-in-one distribution and over-current safety box of the invention is particularly useful; and FIG. 3 is a schematic diagram of the safety box with its main disconnect means for a 4-unit apartment building owner panel helpful in an understanding of the invention with a solar panel array or wind turbine electricity generator.

DETAILED DESCRIPTION OF THE INVENTION

In the block diagrams of FIGS. 1 and 2, the solar panel array or wind turbine generator is identified by the reference numeral 100. The multi-tenant, all-in-one distribution and over-current safety box enclosure is shown as MT.D.OSB at 102, and two tenant units serviced by the solar array or wind turbine are shown at 104 and 106. The overall building owner's house panel is shown at 108, connected by a service circuit outlet and light display kit 110 to a main shutoff switch 112 located at ground level. As previously described, the safety box 102 can be located at an outside wall of the building structure—or more preferably, on the roof, along with the solar panel array and wind turbine generator.

In the block diagram of FIG. 1, reference numeral 114 identifies a series of micro-inverters to convert the DC voltage developed by the array or generator from DC to AC. In the diagram of FIG. 2, on the other hand, a single large inverter 116 is indicated with a conventional tap box 118 to separate the AC voltage for each tenant using unit. With available present day technology, the micro-inverters 114 can be mounted on the back of each solar panel or turbine generator, as contrasted with older multi-tenant building system installations where heavy conductors are brought in on a terminal, to then feed by smaller gauge wires into each breaker of the system by tapping off from the main branch circuit. With both block diagram arrangements, the main shutoff switch 112 can be actuated by a responding fireman in an emergency to shut off all power into the building and to its multiple units. Adequate protection against electrocution within the structure can thus be afforded.

In the schematic of FIG. 3, the screwed-off and padlocked safety box 102, preferably situated adjacent the solar panel array or wind turbine generator on the roof, is provided with an air vent with a weatherproof cover 11 and a ventilation fan 13 with a weatherproof cover 15. A thermostat with an in-line fuse for the ventilation fan 13 is illustrated at 17—then coupled by a quick connect wire harness 19 to a 2-jewel LED display 21 glowing GREEN when the system is "on", RED when the system if "off"—and indicative of the main power or energizing switch being "off" when neither display is glowing. As will be appreciated, the in-line fuse protects the ventilation fan 13 in the event of a power surge that might overwise blow out the fan motor. A service outlet 75 is provided with a bubble cover 33 to allow for the plug-in of power tools if needed, along with a light 24 on an appropriate stanchion (not shown) to provide visibility in working. A quick connect is shown at 25 to attach such a service outlet-light kit. A grounding bar for the solar panel or wind generator, and for the unit panels is shown at 27 and a bonding ground to the frame is shown at 29.

With these components being external to the all-in-one distribution and over-current safety box of the invention, an understanding of their features includes the following:

a) The entire enclosure is constructed of a weatherproof NEMA-3 or plastic/composite type box able to withstand UV radiation and excessive heat buildup—whether the location be on an outside wall of the multi-tenant building structure or on its roof.

b) The enclosure includes an exterior main connecting switch 31 with its lockout 65 for service mounting on the side of the enclosure. The main feed for the disconnecting switch originates from the house panel of a designating 15-20 amp 120 volt circuit which is first fed to a main shut off located at ground level with its own lockout switch cover and thus readily accessible for emergency purposes. The main feed that is supplying the voltage to the coils can then be disconnected. Proper labeling for their designated purpose is provided—and, if more than one system is needed, the ampacity of the various coils of the contactors is evaluated to size the circuit conductors for over-current protection. The exterior main connecting switch essentially controls the multiple pole contactor 61 (to be described) in simultaneously disengaging the entire system.

c) A service GFCI outlet/switch combination unit 75 with its own in-use weatherproof cover 33 is mounted on the side of the enclosure. Such switch controls a pre-assembled light kit required under code enforcement for servicing the safety box and for powering an appropriate service outlet, light kit and other accessories (e.g., a cooling fan), with the terminal block to connect these accessories is indicated at 35.

d) A preassembled 50 watt halogen weatherproof light kit with its own metal conduit pole is provided with the system. Such light kit, as previously indicated, fastens to the safety box enclosure 102 via a ½ inch pre-made knockout located on the side of the enclosure, supported by a standard ½ inch EMT style clamp. The light kit's conductors are connected by the polarized wire harness 25 for quick installation, with the light being controlled ON/OFF by the switch 75 located on the service outlet utilizing the service outlet circuit—the switch 75 being a switch/outlet combination unit.

e) Although the ventilation kit is described, such can be eliminated if desired, with the location for its implementation being selectable in mounting a weatherproof vent cover to promote good air circulation. Also optionable is a power supply plug and play connected to feed a cooling fan with the thermostat accessory kit.

f) A bonding point located on the exterior of the enclosure is available to bond the enclosure, its frame/supports and the frame of the solar panel/wind turbine together. The door for the safety box enclosure is shown at 37.

Referring once again to FIG. 3, the appropriate securement of the safety box 102 to an outside wall or roof of the multi-tenant structure is by way of an appropriate bolt or otherwise, as indicated at 49. Inputs to the distribution and over-current safety box are illustrated at 51—either from a solar array or wind turbine coupling by way of the micro-inverters 114 of FIG. 1 or by way of the large inverter 116 of FIG. 2. A termination point for each of three outputs from the solar panel or wind turbine are shown at 53, 55, 57—at a labeled identifying terminal block which accommodates one terminal for each ungrounded conductor and for the grounded conductor (or Neutral) for each power generating group—the arrangement being for 2 tenant units per termination. The terminal block of each such group couples to a GFCI over-current device 59 (double pole or triple pole depending on the phase of the system) to protect the system at such point of connection for each tenant's solar array or turbine. Each GFCI over-current protection is mounted to a breaker mounting terminal suitable for the type of system connection when bringing multiple isolated power sources to one central location. The amperage for each over-current protection or circuit breaker device will vary based upon the system requirements so as to make each unit protected as it enters the building in preventing harm to the occupants or to emergency services operating at the multi-tenant structure.

After the conductors leave each independent over-current protection device 59, they feed through a common, multiple pole normally open 120 volt electrically held contactor override device or coil switch 61—with the contactor size being based on the number of poles needed based upon the system phase operation and the number of tenant units being serviced. A voltage sensing relay 63 (and/or shunt trip relay connected to a low voltage fire system that will trip the system if a fire alarm is activated) is coupled with the contactor override device 61 to control the tolerance of voltage protecting the system enabling it to operate under ideal conditions if the micro-inverters 114 or large inverter 116 fail to disconnect the voltage being produced. In operation, if the voltage is not sufficient, falling below a prescribed level—either as a result of power failure or a power company system failure—, the voltage sensing unit 63 will cut the power, thereby closing the coil switch override device to prevent damage to the contactor system components. In essence, the contactor coil 61 then serves as a main multiple pole contactor that will disengage the system when power is cut.

A main disconnect switch with a lockout feature is shown at 65, to also control the multiple pole contactor coil switch override 61 in disengaging the system. Such main disconnect switch 65 is to be located at ground level for emergency shut off. Thus, in the event of such an emergency as "fire", or if the system needs to be serviced, the entire systems can be disengaged from the ground by activating the main disconnect switch 65 in preventing the voltage that is being produced by the solar array or turbine from feeding to the designated tenant location panels. Also, in the event of the power failure, the lack of voltage will disengage the coil switch override preventing the back-feed of voltage in protecting any utility crew operating at the time. The weatherproof cover is again shown at 31.

After the circuits of each power generating group leave the main contactor override, the circuits feed through a net metering connection point illustrated by the multiple units 67. Such units monitor all the group's electrical production and performance for the downloading of data by software to a personal computer or hand-held reading device—or remotely broadcast through a hard wire, Bluetooth or wireless transmitting and receiving device. Such monitoring of the output of each unit allows each tenant or monitoring service to know if there are any problems or fault conditions on the system. Alternatively, if net metering is not needed or incompatible with the system units, a plug-in bypass can be installed to feed the voltage through to the proper panels, if some other form of "net metering" can be employed. In this respect, the wireless transmission to download the data of the system is shown at 69 and the hard wiring for downloading the data is shown at 71.

All conductors from the net metering 67 then terminate at a block for each individual tenant—whose number may vary from a single unit in a single tenant structure to several units in a multi-tenant installation. Such termination points are shown at 73 for the case of 2 units per termination block, presently occupied units.

Reference numeral 35 in this respect identifies a terminal point for the service outlet 75, the light kit 24 and the emergency switch main disconnect 65.

And, as previously mentioned, all grounded conductors from the input and output terminate at a centrally grounded terminal block, thereby bonding the whole system and safety box enclosure with the ground rod being bonded to this point as well.

In an actual construction of the multi-tenant distribution and over-current safety box of the invention, all conductors are selected to be properly de-rated for ampacity of the over-current protection and ambient temperature. Wire management clips are employed in isolating the conductors to promote proper spacing and to avoid bundling and the natural heating of conductors. In a typical manufacture, the system is to be manufactured in standard set-ups (i.e., pre-numbered units), or can be built for special orders. As will be appreciated by those skilled in the art, the system concept will also work in a traditional DC system, to be later converted back to AC current with but a few modifications arrived at by converting all the AC rated components to DC and approved rating. All working functions will continue to be fed from the house, or the owner's panel, designed to always be utilizing an AC current system. As will also be evident, the system of the invention can be used in like manner as a splitting load center device feeding off a larger system using a combiner terminal box by reducing the conductors to feed any panels or units that will be fed off the energy generating system. As such, a compliance with the tap rule of the National Electrical Code will follow.

With all conductors feeding from the safety box to each tenant panel being enclosed in metal conduit or flexible metal conduit for extra protection—installed by a certified electrical contractor in accordance with the National Electrical Code—and with the termination on a double pole (or triple pole over-current device rated at the maximum ampacity of the system, all conduits and conductors should be in a size according with the National Electrical Code and/or any local code enforcement adapted for the region of use. In this manner, the problem of there being no present system that addresses the life safety issue of bringing voltage from a solar panel or wind turbine system safely into a multi-unit structure in feeding each panel, is resolvable—and with readily available electrical supply house parts and components. The use of individual or specialized manners of disconnects for each unit would thus be eliminated, thereby reducing the amount of conductors and conduits, or retrofitting any current meter bank which might be present. As will be recognized, such retrofitting cannot be done in most cases, due to the restrictions of physical space in which to work, and by code compliance requirements.

While there have been described what are considered to be a preferred embodiment of the distribution and over-current safety box of the invention, it will be readily appreciated that modifications can be made by those skilled in the art without departing from the scope of the teachings herein. For at least such reason, therefore, resort should be had to the claims appended hereto for a true understanding of the invention.

I claim:

1. An electrical power distribution system for a multi-tenant building structure supporting roof-mounted solar panel or wind turbine generators comprising:
    a weatherproof box enclosure adapted to be secured on one of an outside wall and roof location of, said structure, said box enclosure including:
    a plurality of input terminals adapted to receive alternating current voltages corresponding to direct current voltages generated by said solar panel or wind turbine generator;
    a terminal block having a plurality of identified input and output terminals adapted to distribute the alternating current voltages to individual tenant units within said building structure;
    a multiple pole control unit having individual input and output terminals;
    a plurality of net metering units individually coupling the output terminals of said control unit to the identified input terminals of said terminal block for monitoring individual electric usage at each individual tenant unit;
    a plurality of GFCI over-current protection devices individually coupled between said alternating current voltage receiving input terminals and the input terminals of said multiple pole control unit;

a normally open override switch within said control unit, actuable when closed to disconnect the distribution of alternating current voltage to individual tenant units coupled to output terminals of said terminal block;

a voltage sensing relay and/or shunt trip relay within said control unit actuable to close said normally open override switch in response to monitored alternating current voltages falling below a predetermined level; and whereby said normally open override switch is additionally controllable to disconnect the distribution of alternating current voltages to said individual tenant units in response to actuation of an emergency shut-off switch located at a structure ground level.

2. The electrical power distribution system of claim 1 wherein said box enclosure is one of a weatherproof National Electrical Manufacturers Association-3 and plastic/composite fabrication of an ability to withstand UV radiation and excessive heat buildup.

3. The electrical power distribution system of claim 2 wherein said normally open override switch includes an electrical coil.

4. The electrical power distribution system of claim 3 wherein said box enclosure includes means for securing the box to one of an outside wall and roof location of said multi-tenant building structure.

5. The electrical power distribution system of claim 4 wherein said box enclosure also includes an openable weatherproof door for servicing components therein.

6. The electrical power distribution system of claim 5, also including a preassembled weatherproof light kit coupled to said box enclosure for servicing components within said box enclosure.

7. The electrical power distribution system of claim 6, wherein said box enclosure includes an air vent with weatherproof cover for dissipating heat buildup within said box enclosure.

8. The electrical power distribution system of claim 7, additionally including a ventilation fan with weatherproof cover coupled to said box enclosure for maintaining air flow within said box enclosure.

9. The electrical power distribution system of claim 8, further including a thermostatically controlled cooling fan coupled to said box enclosure for maintaining air flow within said box enclosure.

10. The electrical power distribution system of claim 9, including light emitting diodes coupled to said box enclosure to indicate ON/OFF conditions of operation of said box enclosure.

11. The electrical power distribution system of claim 10, including means coupled to said net metering units for providing externally of the safety box enclosure sources of data as to the amount of alternating current voltage utilized by each individual tenant unit of said multi-tenant building structure.

12. The electrical power distribution system of claim 11, including one of a single inverter and tap box, and a series of micro-inverters, coupled between the input terminals of said box enclosure and said roof-mounted solar panel or wind turbine generator.

* * * * *